United States Patent [19]
Kim et al.

[11] Patent Number: 6,017,777
[45] Date of Patent: Jan. 25, 2000

[54] METHOD OF FORMING A PLATING LAYER OF A LEAD FRAME

[75] Inventors: Joong-do Kim; Young-ho Baek; Kyoung-soon Bok, all of Yongin, Rep. of Korea

[73] Assignee: Samsung Aerospace Industries, Ltd., Kyongsangnam-do, Rep. of Korea

[21] Appl. No.: 08/954,051

[22] Filed: Oct. 17, 1997

[30]  Foreign Application Priority Data

Oct. 18, 1996 [KR] Rep. of Korea ........................ 96-46829

[51] Int. Cl.$^7$ ........................... H01L 21/44; H01L 21/48; H01L 21/50

[52] U.S. Cl. .......................... 438/123; 205/227; 205/228; 205/224; 438/115

[58] Field of Search .................................... 438/123, 115; 205/227, 228, 224

[56]  References Cited

U.S. PATENT DOCUMENTS 4,765,528  8/1988  Sekibata et al. ........................ 228/123
5,151,167  9/1992  Truong et al. .......................... 205/102

Primary Examiner—John F. Niebling
Assistant Examiner—David A. Zarneke
Attorney, Agent, or Firm—Finnegan, Henderson, Farabow, Garrett & Dunner, L.L.P.

[57]  ABSTRACT

A method for forming a plating layer of a lead frame having excellent anti-corrosion properties is provided. At least a portion of a lead frame is plated, then a first heating of the plated portion of the lead frame to a first temperature is performed, and finally a second heating of the first heated plated portion of the lead frame to a second temperature higher than the first temperature is performed. The lead frame manufactured by this method has excellent anti-corrosion properties, such that deterioration of the plating layer, by cracking and inferior solderability, is not observed.

17 Claims, 1 Drawing Sheet

6,017,777

METHOD OF FORMING A PLATING LAYER OF A LEAD FRAME

BACKGROUND OF THE INVENTION

1. Field of the Invention

The present invention relates to a lead frame, and more particularly, to a method for forming a plating layer of a lead frame having improved anti-corrosion properties.

2. Description of the Related Art

A semiconductor lead frame is an important element of a semiconductor package, together with the semiconductor chip. The lead frame connects the inside of the semiconductor package to the outside thereof, and supports the semiconductor chip. In general, such a semiconductor lead frame is manufactured by a stamping or etching method.

According to the stamping method, a thin plate material is formed into a predetermined shape using a press molding apparatus. The stamping method is mainly used for mass producing lead frames.

The etching method is chemical etching in which a predetermined portion of the material is eroded using a chemical, and this method is usually used to manufacture small quantities of lead frames.

In order to form a plating layer on a semiconductor lead frame manufactured by stamping or etching, a metal such as nickel (Ni) is plated on the lead frame and then palladium (Pd) or an alloy of Pd—Ni is plated thereon, where each plating step is performed by an overflow plating method.

The overflow plating is performed according to an electrolytic method or a non-electrolytic method. Of the two methods, the electroplating method is the more widely used.

In the electroplating method, a negative charge is provided to an object to be plated, such as a lead frame, to forcibly precipitate metal cations dissolved in a solution onto the surface of the object as a form of nucleus for growth. Here, the uniformity of the precipitated nucleus depends on the shape of the object to be plated, the current density, and the concentration of metal cations dissolved in the solution. When a nucleus is formed at a spot on the surface of the object to be plated, metal grows from that nucleus. Here, the nucleus growth rate is faster than the nucleus generation rate at an adjacent spot. This phenomenon can be observed by X-ray diffraction. That is, a plating layer having a predetermined crystal orientation can be seen.

In the process of forming the plating layer, gas or bubbles may be interposed between nuclei of the plating layer. Here, ions for facilitating corrosion, e.g., chlorine ions, are easily incorporated within the bubbles. In a salt spray test performed on a lead frame made of Alloy 42, which is formed of a Ni—Fe alloy, after plating the lead frame, an area of localized corrosion forms around the portions having the bubbles within 2–3 hours.

The formation of the area of localized corrosion causes corrosion of the lead frame and a decrease of the electrical conductivity, thereby resulting in a detrimental effect on the characteristics of the lead frame. Thus, after plating the lead frame, harmful gas components are removed by a thermal process, by rearranging the crystalline structure of the plating layer. As a result, the number of bubbles is minimized. In general, the thermal process is carried out in such a way that a lead frame is put into a furnace and then heated for a predetermined amount of time at a high temperature of between 600° C. and 1,000° C. while under a vacuum or in an inert gas atmosphere.

However, when the lead frame is processed at a high temperature of at least 600° C., the surface of the plating layer of the lead frame is oxidized by contact with oxygen in the air.

When an oxide layer is formed on the surface of the plating layer by surface oxidation, a diffusion path is blocked, such that hydrogen remains within the plating layer and cannot diffuse therefrom. As a result, the plating layer corrodes due to the hydrogen molecules remaining in the plating layer, causing cracks and deterioration in solderability.

SUMMARY OF THE INVENTION

To solve the above problems, it is an object of the present invention to provide a method of forming a plating layer of a lead frame having improved anti-corrosion properties.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

Accordingly, to achieve the above object, the present invention, as embodied and broadly defined herein, provides a method of forming a plating layer of a lead frame having an anti-corrosive property, comprising plating at least a portion of a lead frame; first heating the plated portion of the lead frame to a first temperature; and second heating the first heated plated portion of the lead frame to a second temperature higher than the first temperature.

According to another aspect of the invention, as embodied herein, a method of forming a plating layer of a lead frame having an anti-corrosive property, comprises plating at least a portion of a lead frame; removing a hydrogen bubble from the plated portion of the lead frame; and rearranging a crystalline structure of the plated portion of the lead frame.

BRIEF DESCRIPTION OF THE DRAWING

The above object and advantages of the present invention will become more apparent by describing in detail a preferred embodiment thereof with reference to the attached drawing in which.

DESCRIPTION OF THE PREFERRED EMBODIMENT

Figure 1:
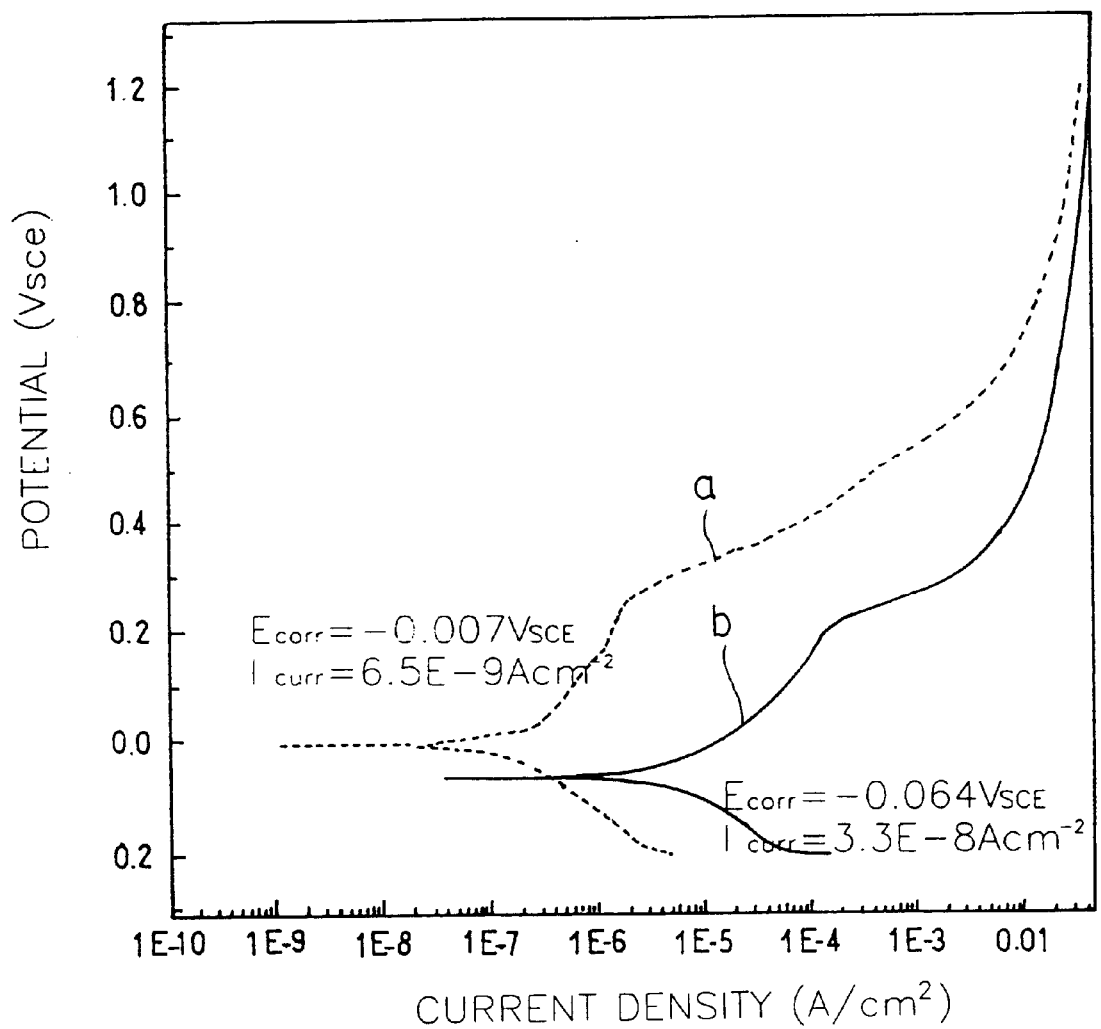
FIG. 1 is a graph illustrating anti-corrosion properties of lead frames respectively manufactured by the method of the present invention and the conventional method.

In a method for forming a plating layer of a lead frame according to the present invention, any metal can be used, if it is commonly used in this art.

In the present invention, the lead frame is treated for a predetermined amount of time (between ten minutes and three hours) at a low temperature, e.g., at a temperature in the range of 150° C. to 250° C., where the oxidation of the lead frame at the surface thereof does not occur. As a result, hydrogen molecules remaining in the plating layer are completely removed. Then, a high temperature thermal process is performed for a predetermined amount of time, e.g., between one half a minute and thirty minutes, at a high temperature, e.g., a temperature in the range of 400° C. to 800° C., to rearrange crystalline structure of the plating layer. Also, other harmful gas components which may have been incorporated by the plating solution together with any hydrogen molecules present can be removed, thereby improving anti-corrosion properties and the electrical conductivity of the lead frame.

In a method for forming a plating layer of a lead frame, conventional electroplating can be used. In general, the electroplating method comprises the steps of dipping at least a portion of a lead frame in a plating bath comprising nickel or nickel alloy and/or palladium or palladium alloy, sequentially, and providing a negative charge to the plating bath to form a nickel or nickel alloy layer and/or a palladium or palladium alloy layer on the lead frame.

A thermal process for rearranging the crystalline structure is then performed on the plated lead frame. As a result, bubbles formed in the plating layer are removed, thereby greatly reducing the potential for localized corrosion. In this process, an elongation ratio of the plating layer can be enhanced, thereby minimizing the generation of cracks.

Hereinafter, the present invention will be described in examples 1–3 and a comparative example. However, these examples are merely illustrative and the present invention is not limited to these examples.

EXAMPLE 1

After performing general defatting and activation processes on the surface of a lead frame composed of Alloy 42 having a thickness of 0.203 mm, plating was performed to add a thickness of 1.2 μm using Ni 6540 (Degussa Co., Germany). Then, electroplating was performed to further increase the additional thickness to 0.2 μm using Pd 451 (Degussa Co., Germany).

Next, a two-step thermal process was performed on the resultant structure. First, a low temperature thermal process to remove hydrogen bubbles from the plating layer was performed by first heating the plated structure to 250° C. for thirty minutes, and then a high temperature thermal process to rearrange the crystalline structure of the plating layer was performed by heating the first heated plated structure at 500° C. for three minutes, resulting in a sample A. Afterwards, an anti-corrosion test and a salt immersion test were performed on sample A by the methods described below. The results are shown in Table 1 and FIG. 1 (graph "a").

EXAMPLE 2

A sample B was prepared by the same method as that in Example 1, except that the high temperature thermal process was performed at 400° C. for three minutes. Afterwards, the salt immersion test was performed on sample B in a same manner as in Example 1. The results are shown in Table 1.

EXAMPLE 3

A sample C was prepared by the same method as that in Example 1, except that the high temperature thermal process was performed at 550° C. for three minutes. Afterwards, the salt immersion test was performed on sample C in a same manner as in Example 1. The result are shown in Table 1.

Comparative Example

A sample D was prepared by the same method as that in Example 1, except that the low temperature thermal process was not performed. Afterwards, the anti-corrosion test and salt immersion test were performed on sample D in a same manner as in Example 1. The results are shown in Table 1 and FIG. 1 (graph "b").

Described below are the anti-corrosion test and salt-containing test that were performed on samples A–D.

1. Anti-Corrosion Test

According to the Tafel extrapolation method, the value of the corrosion potential and the magnitude of corrosion current were measured to evaluate the anti-corrosion properties of the sample being tested.

Here, 5M NaCl solution was used. After immersing the sample in this solution, a value of the corrosion potential $E_{corr}$ and the magnitude of corrosion current $I_{corr}$ were measured by using a Potentiostat/Galvanostat (Model 263A, EG & G Co.). Here, the measuring conditions were −0.2 V of initial potential, 1.2 V of final potential, and 2 mV/sec of scanning speed.

When the corrosion potential value moves in the positive direction, and the magnitude of corrosion current moves in the negative direction, the anti-corrosion property is interpreted to be improved.

2. Salt-Containing Immersion Test

The samples were immersed in 5 wt % NaCl solution at 35° C. for 96 hours, and then the number of corrosion points per plated portion (20×20 mm$^2$) was counted.

TABLE 1

| sample | value of corrosion potential (Vsec) | magnitude of corrosion current (Am$^{-2}$) | number of corrosion points |
|---|---|---|---|
| sample A | −0.064 | 3.3E-8 | 1 |
| sample B | — | — | 4 |
| sample C | — | — | 2 |
| sample D | −0.007 | 6.5E-9 | 67 |

From Table 1 and FIG. 1, it can be seen that the sample A manufactured by the method set forth in Example 1 according to the present invention provides an improvement in anti-corrosion properties compared to the sample D of the comparative example. Also, as can be inferred from the results of the salt immersion test, more corrosion points were observed in the sample D of the comparative example than in the samples A, B and C. Thus, the lead frame manufactured by the present invention has improved anti-corrosion properties.

As described above, the lead frame having a plating layer manufactured by the method according to the present invention has excellent anti-corrosion properties, so that deterioration of the plating layer, including cracking and inferior solderability, is not observed.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a plating layer of a lead frame having an anti-corrosive property, comprising:

sequentially plating at least a portion of a lead frame with a nickel or nickel alloy and a palladium or palladium alloy;

first heating said plated portion of the lead frame to a first temperature for a predetermined amount of time; and second heating said first heated plated portion of the lead frame to a second temperature higher than the first temperature.

2. The method of claim 1, wherein said first heating includes heating said plated portion to said first temperature in the range of 150° C. to 250° C. for a period of time not less than ten minutes and not greater than three hours.

3. The method of claim 1, wherein said second heating includes heating said plated portion to said second temperature in the preferred range of 400° C. to 550° C. for a period of time not less than one half a minute and not greater than thirty minutes.

4. The method of claim 1, wherein said sequentially plating includes dipping the lead frame made from Fe—Ni alloy in a plating bath having a metal selected from the group consisting of nickel, nickel alloy, palladium, and palladium alloy.

5. The method of claim 1, wherein said first heating includes heating the plated portion to said first temperature of 250° C. for thirty minutes.

6. The method of claim 1, wherein said second heating includes heating said plated portion to said second temperature of 550° C. for three minutes.

7. The method of claim 1, wherein said second heating includes heating said plated portion to said second temperature of 400° C. for three minutes.

8. The method of claim 1, wherein said first heating includes heating the plated portion to said first temperature in the range of 150° C. to 250° C., and wherein said second heating includes heating the plated portion to said second temperature in the preferred range of 400° C. to 550° C.

9. The method of claim 1, wherein said first heating includes heating the plated portion to said first temperature for a period of time not less than ten minutes and not greater than three hours, and wherein said second heating includes heating the plated portion to said second temperature for a period of time not less than one half a minute and not greater than 30 minutes.

10. The method of claim 1, wherein said first heating includes heating the plated portion to said first temperature of 250° C. and said second heating includes heating the plated portion to said second temperature of 500° C.

11. The method of claim 1, wherein said first heating includes heating the plated portion to said first temperature of 250° C. and said second heating includes heating the plated portion to said second temperature of 400° C.

12. The method of claim 1, wherein said first heating includes heating the plated portion to said first temperature of 250° C. and said second heating includes heating the plated portion to said second temperature of 550° C.

13. The method of claim 1, wherein said first heating includes heating the plated portion to said first temperature of 250° C. for thirty minutes and said second heating includes heating the plated portion to said second temperature of 500° C. for three minutes.

14. The method of claim 1, wherein said first heating includes heating the plated portion to said first temperature of 250° C. for thirty minutes and said second heating includes heating the plated portion to said second temperature of 400° C. for three minutes.

15. The method of claim 9, wherein said first heating includes heating the plated portion to said first temperature of 250° C. for thirty minutes and said second heating includes heating the plated portion to said second temperature of 550° C. for three minutes.

16. The method of claim 1, wherein said first heating includes heating the plated portion to said first temperature in the range of 150° C. to 250° C. for a period of time not less than ten minutes and not greater than three hours, and wherein said second heating includes heating the plated portion to said second temperature in the preferred range of 400° C. to 550° C. for a period of time not less than one half a minute and not greater than thirty minutes.

17. A method of forming a plating layer of a lead frame having an anti-corrosive property, comprising:

sequentially plating at least a portion of a lead frame with a nickel or nickel alloy and a palladium or palladium alloy;

removing a hydrogen bubble in said plated portion of the lead frame; and rearranging a crystalline structure of said plated portion of the lead frame.

* * * * *